(12) United States Patent
Duesman

(10) Patent No.: US 6,466,053 B2
(45) Date of Patent: Oct. 15, 2002

(54) ANTIFUSE REROUTE OF DIES

(75) Inventor: Kevin Duesman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/061,715

(22) Filed: Feb. 1, 2002

(65) Prior Publication Data

US 2002/0130687 A1 Sep. 19, 2002

Related U.S. Application Data

(62) Division of application No. 09/809,537, filed on Mar. 15, 2001.

(51) Int. Cl.[7] .................. H03K 19/173; H01L 23/02
(52) U.S. Cl. .................. 326/47; 326/101; 326/38; 365/230.06; 365/200; 257/685; 257/686; 257/530; 257/777
(58) Field of Search .................. 326/47, 101, 38; 365/225.07, 230.06, 200, 189.01; 327/525; 257/685, 686, 530, 777

(56) References Cited

U.S. PATENT DOCUMENTS 5,724,282 A * 3/1998 Loughmiller ................ 365/96
6,087,722 A * 7/2000 Lee et al. ................ 257/723
6,114,878 A * 9/2000 Loughmiller ................ 326/101
6,252,305 B1 * 6/2001 Lin et al. ................ 257/777

* cited by examiner

Primary Examiner—Michael Tokar
Assistant Examiner—Vibol Tan
(74) Attorney, Agent, or Firm—Killworth, Gottman, Hagan & Schaeff, LLP

(57) ABSTRACT

A semiconductor die is provided with an internally programmable router to assign signal paths to select connection points. A switching matrix incorporating at least one antifuse is utilized to selectively route signal paths on the semiconductor die. The chips can then be used individually, for example to reconfigure chip pin assignments to operate in a plurality of different socket layouts, or where features or controls of a chip are selectively enabled or disabled. A further alternative involves programming a first chip, then stacking piggyback, or one on top of the other, the first chip onto a second chip. The contact pins are electrically coupled together, thus avoiding the need for external frames and pin rerouting schemes to form stacked chips. In the stacked chip configuration, control pins are rerouted to align with unused pins on the chip stacked against.

28 Claims, 5 Drawing Sheets

ANTIFUSE REROUTE OF DIES

CROSS REFERENCE TO RELATED APPLICATIONS

This application is a division of U.S. patent application Ser. No. 09/809,537, filed Mar. 15, 2001.

BACKGROUND AND SUMMARY OF THE INVENTION

The present invention relates generally to integrated circuits, and more particularly to integrated circuits with programmable contacts.

Known semiconductor chips incorporate packaged dies that contain a plurality of contact pads. The contact pads are electrically coupled to discrete external contact pins that extend from the die packaging for interfacing the semiconductor to external components. While this configuration is acceptable in some applications, it has been recognized by the present inventors that certain applications benefit where a signal path within the chip can be rerouted to different physical locations on the packaging.

Known techniques for rerouting the physical termination point on a semiconductor chip sometimes require external components such as frames and packages, such as those used for chip stacking. Further, some techniques are expensive to implement, require a number of components, and take considerable time to fabricate, often resulting in additional testing requirements. Depending upon the sophistication of the process deployed, as many as eight additional steps are required to form a complete chip with a rerouted pin. Further, the additional parts required, the additional testing required and the production speed lost due to the added steps all affect the cost of fabricating chips with rerouted contact pins.

SUMMARY OF THE INVENTION

The present invention overcomes the disadvantages of previously known rerouting and chip stacking techniques. According to the present invention, semiconductor chips are provided with an internally programmable routing circuit to assign signal paths to select connection points. This allows a user to utilize the same chip fabricating apparatus and testing devices for a number of chips that have different final configurations. This technique is useful in any number of applications including enabling and disabling select features of a chip, rerouting the contact pins to accommodate various sockets, and relocating select contact pins such as chip enable, or input/output lines for forming chip stacks. In a chip stack according to the present invention, once the chips are tested, they can be programmed such that select signal paths line up in parallel, while other signal paths are routed to unused pin locations. The chips are then stacked piggyback, or one on top of the other, and the contact pins are electrically coupled together, thus avoiding the need for external frames and pin rerouting schemes.

In accordance with one embodiment of the present invention, a signal routing circuit is provided. A first signal path includes a first segment and a second segment. A logic circuit is coupled to the first segment of the first signal path, while a first connector pad is coupled to the second segment of the first signal path. A routing matrix circuit is in-line with the first signal path disposed between the first and second segments. The routing matrix circuit is programmable between a first state wherein the first segment is coupled to the second segment, and a second state wherein the first segment is decoupled from the second segment. A programming circuit is coupled to the routing matrix circuit for programming the routing circuit between the first and second states. Where there is concern that the programming circuit will introduce signals that may damage circuits or connectors connected to the routing matrix, it is preferable that the programming circuit be capable of isolating the routing matrix circuit from the first and second segments of the first signal path during programming.

In addition to allowing a single signal path to be programmably coupled or decoupled from the circuit logic, the routing matrix circuit may further include a plurality of second segments, each of the plurality of second segments independent from one another and routed to a discrete connection point. Under this arrangement, the first and second states of the routing matrix circuit are programmable between the first segment and each of the plurality of second segments so that the first segment can be isolated from every one of the connectors on the second segment side of the routing matrix. Alternatively, the first segment can be programmed to be routed to one or more of the plurality of second segments to route the first segment between any number of possible physical connection positions.

As an alternative to routing one internal signal to any possible combinations of physical external connections, a single physical connection can be routed to any number of internal signal paths. Under this arrangement, the first segment further comprises a plurality of first segments, each of the plurality of first segments independent from one another, and wherein the first and second states of the routing matrix circuit are programmable between each of the plurality of first segments and the second segment. Depending upon the complexity and routing options required, the first segment may further comprise a plurality of first segments, and the second segment may further comprise a plurality of second segments, wherein the routing matrix is programmable to selectively couple and decouple any of the plurality of first segments to any of the plurality of second segments.

The determination of routing configuration for the routing matrix may be stored using at least one antifuse. In one circuit according to the present invention, the antifuse may be disposed serially between the first and second segments of the first signal path. Under this approach, where there is a concern that the programming voltage will damage additional circuitry coupled to the antifuse, the routing matrix circuit further comprises a first programming switch positioned serially between the antifuse and the first segment, the first programming switch is operatively coupled to the programming circuit and is capable of isolating the antifuse from the first segment. A second programming switch is optionally positioned serially between the antifuse and the second segment, the second programming switch operatively coupled to the programming circuit and capable of isolating the second segment from the antifuse.

As an alternative to using the antifuse serially with the first signal path, the antifuse can be used as a control signal to trigger a switching matrix. Under this arrangement, the routing matrix circuit further comprises a switching matrix disposed between the first and second segments of the first signal path, at least one antifuse coupled to a programming circuit, and a sensing circuit coupling the antifuse to the switching matrix. The switching matrix comprises at least one switch and can include additional logic including demultiplexors and decoders depending upon the sophistication of the rerouting required. The sensing circuit outputs at least one switch control signal coding the programmed state of the antifuse. This signal is used to operatively control at least one switch.

The switching matrix coupled to the antifuse sensing circuit includes a first side contact pad, a second side contact pad, and at least one switch disposed between the first side contact pad and the second side contact pad, wherein the switch acts as an open circuit when the antifuse is in a first state, and the switch acts as a closed circuit when the antifuse is in a second state. The first and second states represent blown or programmed, and unblown or unprogramed states of the antifuse. Further, the contact pads can be implemented merely as connection points to either side of the switching element. Further, the switching matrix may include a plurality of first side contact pads, such that the switch is programmable to selectively couple and decouple the second side contact pad to any of the plurality of first side contact pads. Alternatively, the switching matrix may include a plurality of first side contact pads and a plurality of second side contact pads. Under this arrangement, the switch is programmable to selectively couple and decouple any of the plurality of first side contact pads to any of the second side contact pads.

In accordance with another embodiment of the present invention, a bare semiconductor die is formed with internally assignable contact pads. The semiconductor die comprises a logic circuit, a programmable routing matrix, a signal path coupling the logic circuit to the routing matrix, and a contact pad coupled to the routing matrix. The routing matrix comprises a switching circuit programmable between a first state wherein the signal path is coupled to the contact pad, and a second state wherein the signal path is decoupled from the contact pad.

The semiconductor die may optionally include a plurality of signal paths coupling the logic circuit to the routing matrix. Under this arrangement, the switching circuit is programmable between the first and second states for each signal path to selectively route any of the plurality of signal paths to the contact pad. Alternatively, the semiconductor die may further comprise a plurality of contact pads coupled to the routing matrix. Under this arrangement, the switching circuit is programmable between the first and second states for each contact pad to selectively route any of the plurality of contact pads to the signal path.

As yet another alternative, the semiconductor die may further comprise a plurality of contact pads coupled to the routing matrix and a plurality of signal paths coupling the logic circuit to the routing matrix. Where the routing matrix receives multiple contact pads and multiple signals, the switching circuit is programmable to selectively couple and decouple any of the plurality of contact pads to any of the plurality of signal paths.

The switching circuit may be realized using at least one antifuse. To use the antifuse in a switching capacity, the antifuse is positioned serially between the contact pad and the signal path, and a programming circuit is coupled to the antifuse. As an alternative to using the antifuse as a switch, the antifuse can be used to control a switch, including transistor-based switches. For example, the routing matrix circuit may be embodied using a switching controller including at least one antifuse, an antifuse programming circuit coupled to the antifuse, an antifuse sensing circuit coupled to the antifuse, and a switching matrix having at least one switch controlled by the switching controller. Further, demultiplexing, decoding and other logic circuits may be used to couple the antifuse sensing circuit to the at least one switch to provide the necessary translation of the antifuse states to signals suitable to control the switching matrix.

With reroutable semiconductor dies and packaged semiconductor chips, numerous stacking schemes can be easily realized. For example, two or more chips can be stacked in a piggyback fashion such that select contact pins from each chip align and are coupled together, and one or more of the chips can reprogram select signal paths to achieve numerous results. As one such example, signal paths can be rerouted in such a manner that alike functions such as address, input and output contact pins of the various chips align in a manner to share common connections. Alternatively or additionally, signal paths may be rerouted such that a signal line on a first chip couples to an unused contact pin on a second chip. For example, two chips can be piggybacked such that power, and input/output lines align, and chip select signal lines of a first chip are rerouted to couple to an unused contact pin of a second chip. Likewise, a chip select line of the second chip can be configured to align and couple to an unused contact pin of the first chip. Accordingly, the input, output and power lines of the piggybacked chips can share common connections, and each chip may be individually accessed because the chip select for each chip are isolated from one another.

Reroutable contacts find numerous applications in the fabrication of memory devices wherein the memory device includes a logic circuit having an array of storage cells, an address decoder coupled to the array of storage cells, and a memory controller coupled to the array of storage cells. A plurality of conductive paths are coupled to the logic circuit, wherein the plurality of conductive paths comprise for example, a plurality of input/output, address, and chip select conductive paths coupled to the logic circuit. Additionally, a plurality of contacts are coupled to the plurality of conductive paths, and a programmable rerouting circuit is serially positioned between at least one of the plurality of contacts and at least one of the plurality of conductive paths.

According to one embodiment of the present invention, a rerouting circuit is programmable to route and insulate a chip select conductive path between at least two contacts. The non-selected contact is accordingly isolated from a memory logic circuit. Alternatively, the rerouting circuit is programmable to route and insulate the input/output conductive paths between the contacts. Under either of these arrangements, a second memory device may be provided, either identical to the first memory device or otherwise. Preferably, both memory devices will have at least one unused contact. The memory devices are piggybacked and the contacts of the devices coupled in parallel.

Where the goal is to increase the total storage capacity of the chip stack, the chip select of the reroutable memory chip is reassigned such that it aligns with the unused contact of the second memory device. The chip select of the second memory device should align with the unused contact of the first memory device. The power, input/output, address, or other lines are positioned to align in parallel configuration. Thus the two devices can share the same data, address, and power connections, and still be individually selectable because the chip select for each memory device includes a discrete connection.

Alternatively, where the first, reroutable memory device includes multiple input/output lines, and a like number of unused contacts, and the second memory device includes the same number of unused contacts, the two memory devices can be programmed and stacked piggyback such that the input/output lines of the first memory device align with unused contacts of the second memory device, and the input/output of the second memory device align with the unused contacts of the first memory device. All other contacts are positioned to align in parallel with like connections. Accordingly the power, chip select, and other reference contacts align. Under this arrangement, an enable signal enables both chips simultaneously, and each memory device input/outputs contacts are discretely routed. Thus a single address can now provide an increased word length on the total input/output lines available, over each memory device individually.

It will be appreciated that the present invention can be used to reprogram bare dies, or finished packaged chips. Further, the rerouting of contacts can be used to implement stacked die as well as stacked chip arrangements. While described as stacking of two devices, any number of stacked devices can be realized, depending upon the number of unused pins available, and the sophistication of the routing and switching circuitry implemented. Further, the present invention can be utilized to increase capacity of stacked combinations, used to reconfigure a single chip to accommodate a number of different socket configurations, or to change the features or function of a single or multiple devices.

BRIEF DESCRIPTION OF THE SEVERAL VIEWS OF THE DRAWINGS

The following detailed description of the preferred embodiments of the present invention can be best understood when read in conjunction with the following drawings, where like structure is indicated with like reference numerals, and in which.

DETAILED DESCRIPTION OF THE PREFERRED EMBODIMENTS

The following detailed description references drawings that show by way of illustration, and not by way of limitation, specific embodiments in which the present invention may be practiced. It is to be understood that based upon the functional description herein, other embodiments may be realized, and structural as well as logical changes may be incorporated without departing from the scope of the present invention.

Figure 1:
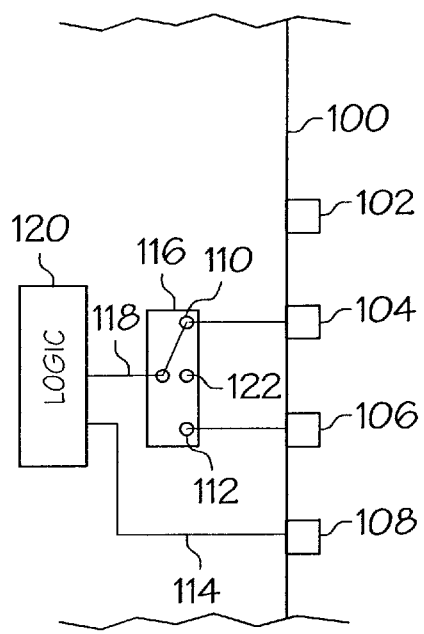
FIG. 1 illustrates in block diagram fashion, a logic line switchable between two external pin connections on a packaged semiconductor chip.

Referring to FIG. 1, the present invention is illustrated in a simplified block diagram. The packaged semiconductor 100 includes a plurality of external pin connectors 102, 104, 106, 108. Connector pin 102 is unused and is therefore isolated electrically from the logic circuit 120. Accordingly, an external signal applied to contact pin 102 will be isolated from the logic circuit 120. Connector pin 108 is coupled to the logic circuit 120 via a dedicated circuit path 114. A circuit path 118, couples the logic circuit 120 to a routing matrix 116. Depending upon the state of the routing matrix 116, the logic circuit 120 is coupled to either connector pin 104 via circuit paths 118 and 110, to connector pin 106 via circuit paths 118 and 112, or alternatively, the signal path 118 may terminate, for example at node 122, wherein the signal path 118 is not coupled to any connection pin. Notably, where the signal path 118 is coupled to pin 104, the connector pin 106 is uncoupled from the logic circuit 120, thus a signal applied to connection pin 106 is isolated from the logic circuit 120.

It is to be understood that the logic circuit can be any circuit including for example, memory devices, microprocessors, gates, and converters. Further, any number of pins, including electrically isolated and electrically conductive pins may be included with the packaged semiconductor 100. Additionally, the electrically conductive pins, including those coupled through the routing matrix, may carry power connections including ground and supply voltages, may include input/output data information, chip selection or enabling information, clock signals, reference signals, address information, or any other type of signal to be applied to a logic circuit. Depending upon the application and the sophistication of the signal rerouting required, any known technique for constructing the routing matrix 116 may be implemented. For example, the routing matrix can be a single switch, fuse, antifuse, or as sophisticated as necessary, including for example, demultiplexors, decoders, switching matrices, and switching arrays.

One method of controlling the routing matrix is through the use of antifuses. An antifuse is a circuit element useful for providing selective one time programmable permanent electrical connections between circuit nodes. An antifuse can be implemented with a structure similar to that of a capacitor. In its default state, a dielectric layer separates two conductive terminals. This provides a high resistance between the antifuse terminals, resulting in an "off" state without programming. The antifuse can be programmed to an "on" state by applying a large programming voltage across the antifuse terminals. Upon the application of a large voltage, the dielectric breaks down forming conductive pathways between the terminals. The conductive pathways effectively lower the antifuse resistance. Once programmed however, the antifuse cannot be programmed back to an off state.

Figure 2:
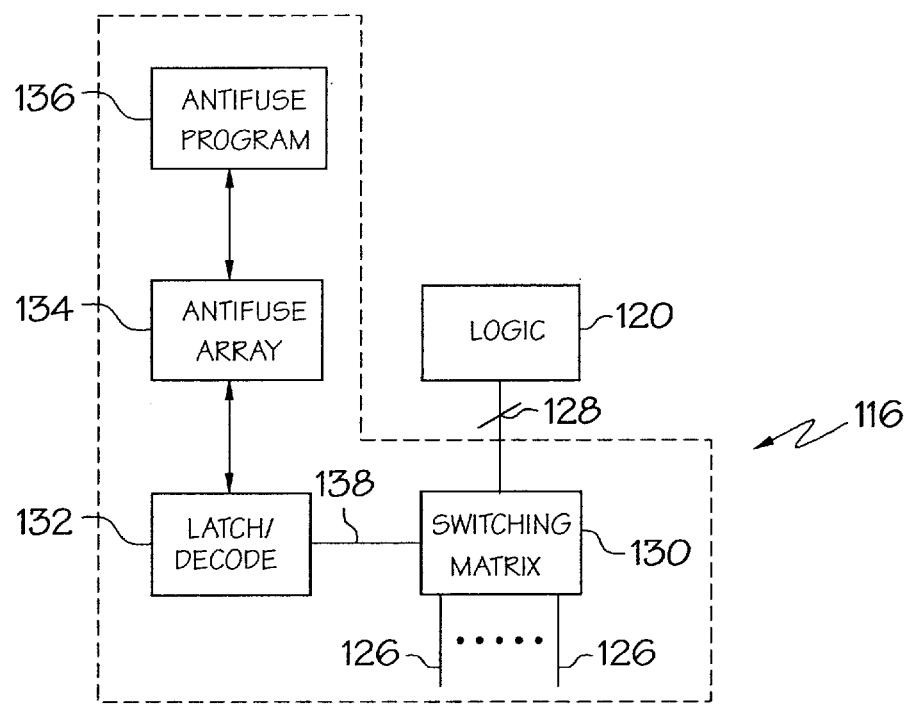
FIG. 2 is a block diagram of a system for routing one or more logic lines to any of several external pin connections on a packaged semiconductor chip using an array of antifuses.

Referring to FIG. 2, a block diagram is presented illustrating one method for using an antifuse to reroute signals from one connection pin to another. Any number of signal paths 128 couple the logic circuit 120 to the routing matrix 116. The number of circuit paths 128 will depend upon the number of paths desired to be switched, rerouted or terminated. The signal paths 128 feed into a switching matrix 130. The switching matrix 130 assigns each individual signal path 128 to any of the possible connector paths 126. Any one of the signal paths 128 can be routed to one or more of the possible connector paths 126, or alternatively, any one of the signal paths 128 can be isolated from the connector paths 126.

To determine the switching pattern, an antifuse array 134 is programmed by selectively blowing one or more antifuses in the array using programming circuit 136. Latch circuit 132 is a sensing circuit that reads the state of the antifuses in the antifuse array 134 and presents a control signal 138 to the switching matrix 130. Depending upon the number of antifuses implemented, the latch circuit 132 may encode the states of the antifuses into a smaller number of control lines. Where the latch circuit encodes the states of the antifuses in the antifuse array 134, the switching matrix 130 includes additional decoder logic.

Figure 3:
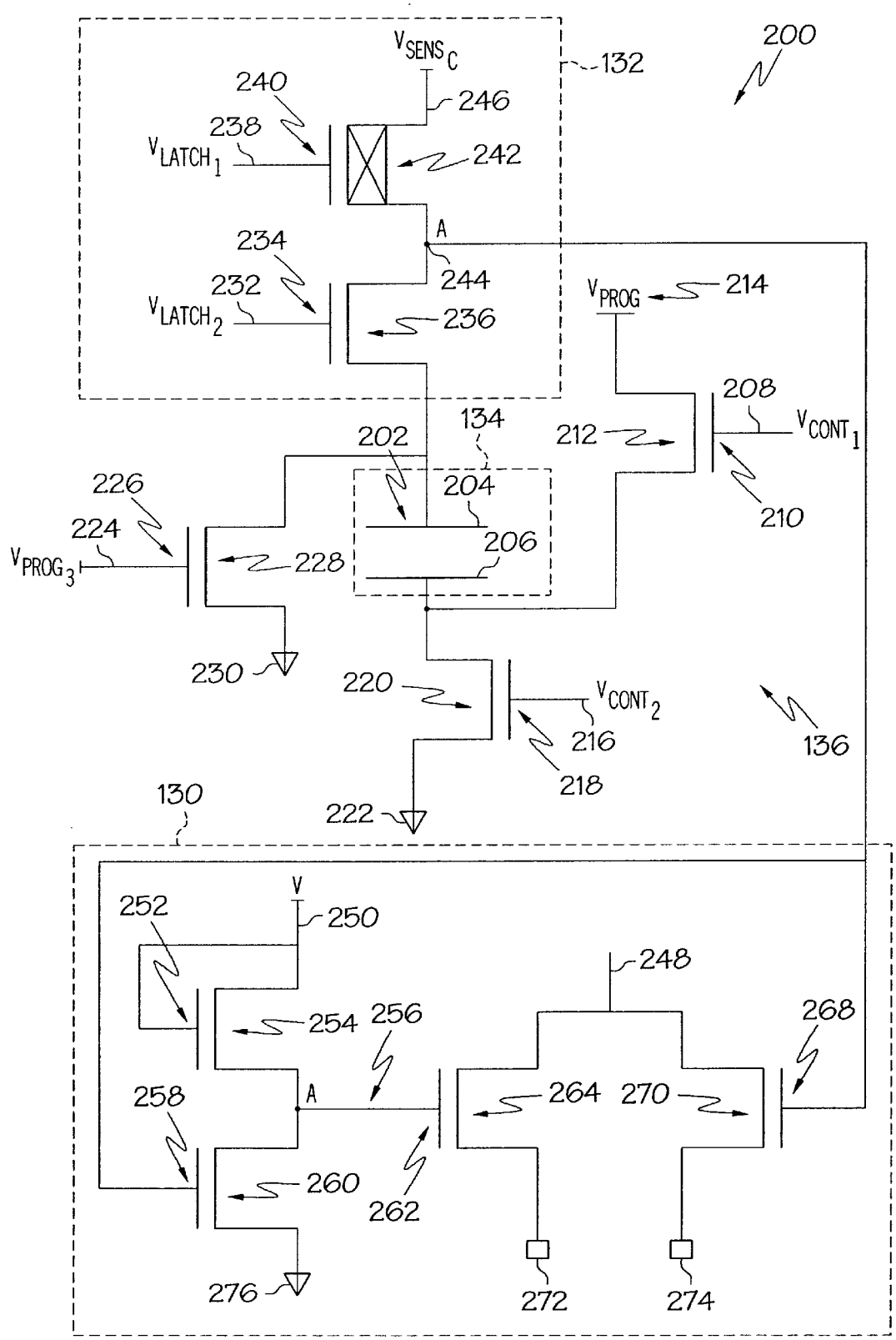
FIG. 3 is a simplified schematic of a circuit for routing one logic line between two external pin connections on a packaged semiconductor chip.

Referring to FIG. 3, an example of an implementation of a pin programming and routing circuit 200 is illustrated. In this example, a signal 248 is routed to one of two possible connections 272, 274. This can be used for example, to program a chip select signal to one of two possible connectors, leaving the unused connector isolated from the logic circuit (not shown). Firstly, it should be appreciated that the flexibility and structure of the typical antifuse results in a broad degree of latitude to the designer to vary the design of the rerouting circuit. Further, any routing scheme can be developed based upon the application to which the chip is to be used, and the requirements of the intended applications for the chip. Accordingly, FIG. 3 is intended to be for illustration and not considered a limitation.

The rerouting circuit 200 comprises an antifuse array 134 coupled to a latching or sensing circuit 132, and to a programming circuit 136. The output of the sensing circuit 132 is coupled to the switching matrix 130. Specifically, switching action of the switching matrix 130 is controlled by the state of the antifuse array 134. While shown herein with only one antifuse 202, it is to be understood that any number of antifuses 202 may be implemented, depending upon the number of signals to be programably rerouted and other like considerations. Typically, control signal Vcont1 208 is biased such that the gate 210 of transistor 212 is closed, and the program voltage Vprog 214 is isolated from the antifuse 202. Control signal Vcont2 216 is biased such that the gate 218 of transistor 220 is open, and the second plate 206 of antifuse 202 is effectively coupled to ground 222 through transistor 220. The state of control signal Vcont3 224 is biased such that the gate 226 of transistor 228 is closed, effectively isolating the first plate 204 of antifuse 202 from a path to ground 230, through transistor 228.

The sensing circuit 132 reads the state of antifuse 202 by biasing control signal Vlatch1 238 to open the gate 240 of transistor 242, and further, by biasing control signal Vlatch2 232 to open the gate 234 of transistor 236 effectively coupling the sensing voltage Vsense 246 through transistors 242 and 236 to the antifuse 202. The gate 226 of transistor 228 is off isolating the first plate 204 of antifuse 202 from ground 230 through transistor 228. Likewise, the gate 210 of transistor 212 is closed to isolate the programming voltage Vprog 214 from the antifuse 202. The gate 218 on transistor 220 is open effectively connecting the second plate 206 of antifuse 202 to ground 222 through transistor 220.

If the antifuse 202 is unprogramed, or unblown, the dielectric layer between the first and second plates 204, 204 isolates the sensing voltage Vsense 246 from seeing ground through the antifuse 202, thus the voltage at node 244 will be the sensing voltage 246. All paths to ground through the antifuse 202 are essentially floated. If the antifuse 202 is programmed or blown, then conductive pathways are developed through the dielectric separating the first plate 204 from the second plate 206, and the sensing voltage 246 finds a path to ground 222 through antifuse 202 and transistor 220. This pulls the voltage at the reference node 244 towards ground. Accordingly, the sensing circuit realizes a voltage approximately equal to sensing voltage Vsense 246 when the antifuse 202 is unblown, and a voltage approximating ground when the antifuse 202 is blown.

It should be appreciated that in this simple example, only one signal is to be rerouted. Any more complex sensing and coding schemes may be utilized depending upon the application. For example, where numerous signals are to be potentially rerouted, a plurality of antifuses 202 would be utilized, each separately programmable. Further, the sensing of the antifuse states may be coded or otherwise manipulated using any technique including multiplexing, encoding, and the like.

To program the antifuse 202, Vcont2 216 is biased to close the gate 218 of transistor 220. The antifuse 202 is now isolated from ground 222 through transistor 220. Likewise, control signal Vlatch2 232 is biased to close the gate 234 of transistor 236, turning off transistor 236 and thus isolating the sensing circuit 132 from the antifuse 202. Next, control signal Vcont1 208 is turned on. Vcont1 208 is biased to open the gate 210 of transistor 212. Accordingly, the programming voltage Vprog 214, is coupled to the second plate 206 of the antifuse 202. The transistor 228 is turned on by biasing the control signal Vprog3 224 to open the gate 226 of transistor 228, thus coupling the first plate 204 of the antifuse 202 to ground 230 through transistor 228. When both the programming voltage Vprog 214 is applied to the second plate 206 of the antifuse 202, and the first plate 204 of antifuse 202 is tied to ground 230, the voltage differential between the first and second plates 204, 206 should be sufficient to break down the dielectric formed between the first and second plates 204, 206 thus forming a reduced resistance circuit path.

Turning off transistor 236 isolates the circuit other than the antifuse from the programming voltage Vprog 214. The excessive voltage sometimes required to blow the antifuse 202 may damage other portions of the circuit. Where all other circuit elements would be unaffected by the higher programming voltage Vprog 214, it may be unnecessary to close the gate 234 of transistor 236. Likewise, transistors 212, 220 and 228 should be designed so as to be able to withstand the higher voltages and currents associated with programming the antifuse 202. Further, as the antifuse 202 is a one time programmable device, the programming operation need only be performed once, usually some time after fabrication and testing. It should be appreciated that programming can be accomplished when the device is in the form of a bare semiconductor die, or alternatively, it can be programmed in a finished package. Finally, since the antifuse 202, by design is fabricated in an unblown state, programming may not be required.

The reference node 244 provides a signal that reflects the state of the antifuse 202. The voltage at the reference node is applied directly to the gate 268 of transistor 270. A copy of the reference voltage at node 244 passes through an invertor circuit formed by transistors 254 and 260. When the reference voltage is low, the gate 258 at transistor 260 is closed and the invertor node 256 is isolated from ground 276 through transistor 260. Transistor 254 is always on because the invertor reference voltage 250 is tied to the gate 252 of the transistor 254 thus allowing the invertor node 256 to stay high. When the reference node 244 is high, the gate 258 of the transistor 260 opens effectively coupling inverter node 256 to ground. Accordingly, the control signal at the gate 262 will generally be opposite that of gate 268, and only one of the transistors 264, 270 will be on at any given time. Signal 248 is accordingly passed to either connection 272 or connection 274. The unused connection is isolated from the circuitry.

Figure 4:
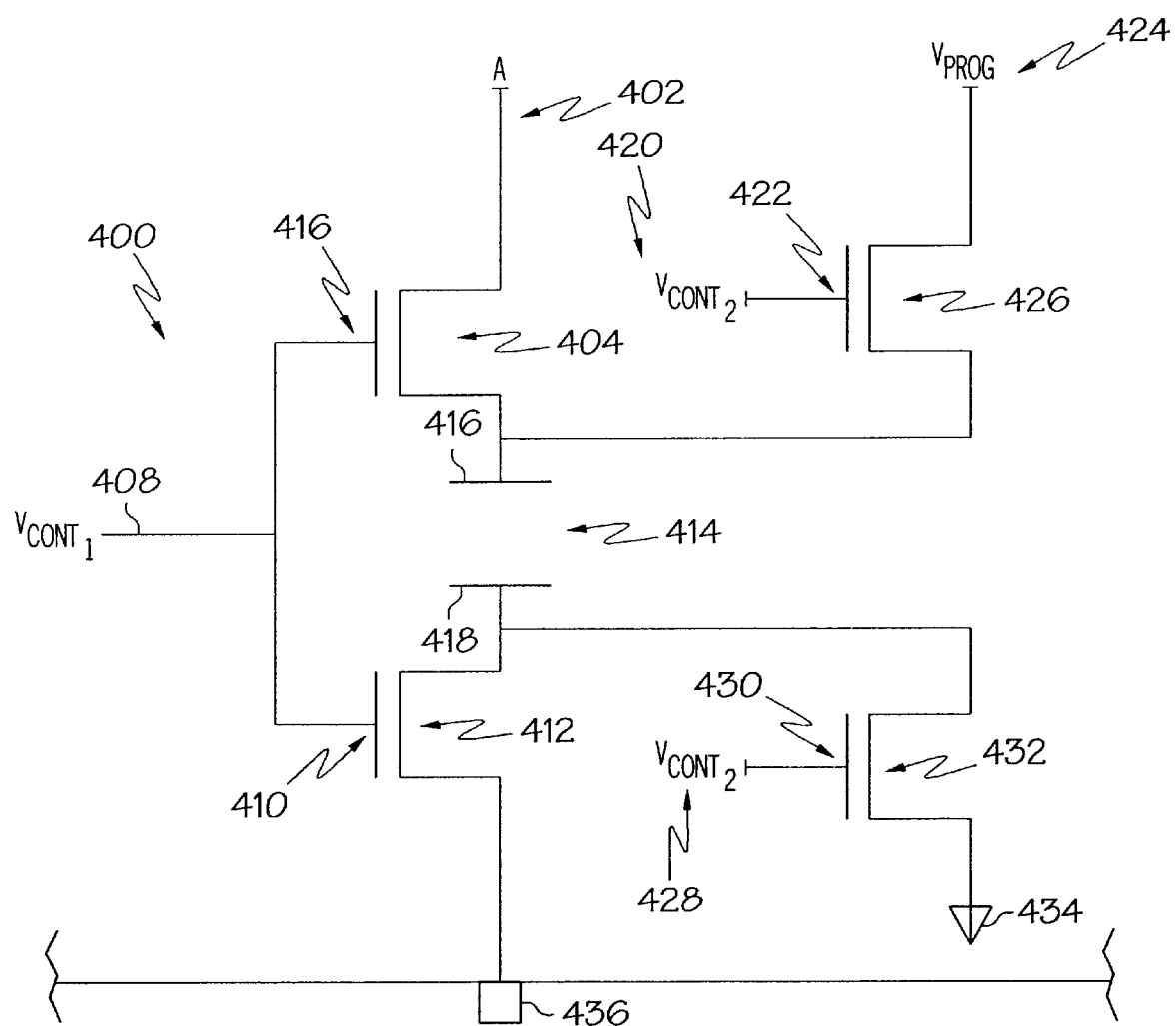
FIG. 4 is a simplified schematic diagram of a circuit for rerouting a signal path in a semiconductor using an antifuse, wherein the antifuse is in-line with the signal path.

An alternative arrangement for using antifuses to reroute signals is to place the antifuse in the signal path directly. Referring to FIG. 4, a signal 402 is coupled to external pin connector 436 via transistors 404, 412, and antifuse 414. During normal operation, control signal Vcont1 is biased such that the gate 406 of transistor 404 is open, and likewise the gate 410 of transistor 412 is open. Control signal Vcont2 420 is biased such that the gate 422 of transistor 426 is closed isolating the programming reference signal 424 from the antifuse 414. Likewise, the control signal Vcont3 428 is biased such that the gate 430 of transistor 432 is closed isolating the antifuse 414 from a path to ground 434 through transistor 432. Accordingly, the programming circuit is isolated from the antifuse 414. If the antifuse 414 is unprogramed, or not blown, the dielectric between the first plate 416 and second plate 418 of the antifuse insulates the signal 402 form external connector pin 436. To couple signal 402 to external connection pin 436, the antifuse is programmed, or blown.

To program the antifuse 414, the control signal Vcont1 is biased to isolate the antifuse. Under this arrangement, the gate 406 of transistor 404 is closed isolating the first plate 416 of the antifuse 414 from the signal 402, and the gate 410 of transistor 412 is closed to isolate the second plate 418 of the antifuse 414 from external connection pin 436. This is done to protect the signal path 402 and the external connection pin 436 from the programming voltage. Should the components be able to withstand the program voltage without harm, their presence is not required. Once isolated, control signal 420 is biased such that the gate 422 of transistor 426 is open, coupling the programming reference voltage Vprog 424 to the first plate 416 of antifuse 414.

Additionally, the control voltage Vcont3 428 is biased to open the gate 430 of transistor 432 effectively tying the second plate 418 of the antifuse 414 to ground 434 through transistor 432. Under this arrangement, current flows through the antifuse 414, breaking down the dielectric between the first plate 416 and the second plate 418 and creating conductive pathways between the first and second plates 416, 418 of the antifuse 414. It should be appreciated that, while illustrated with only one antifuse, and only one external pin connector, any number of antifuses can be utilized to route any number of signal paths to external connection pins. Further, known processing techniques may be used, including demultipliexors, encoders, decoders, antifuse arrays, antifuse matrices and the like may be used.

A Stacked Memory Device

Based upon a circuit similar in function to that illustrated in FIG. 3 or 4, a stacked memory device can be easily realized. For example, memory chips can be stacked together to either increase available word size, or alternatively to increase total memory capacity. Where increased storage capacity is to be realized, two or more chips can be stacked together. The power, address, and input/output lines are all tied together in parallel, while each chip retains a unique routing to its chip select or chip enable pin. This is typically accomplished by the use of external, complex stacking frames.

Figure 5:
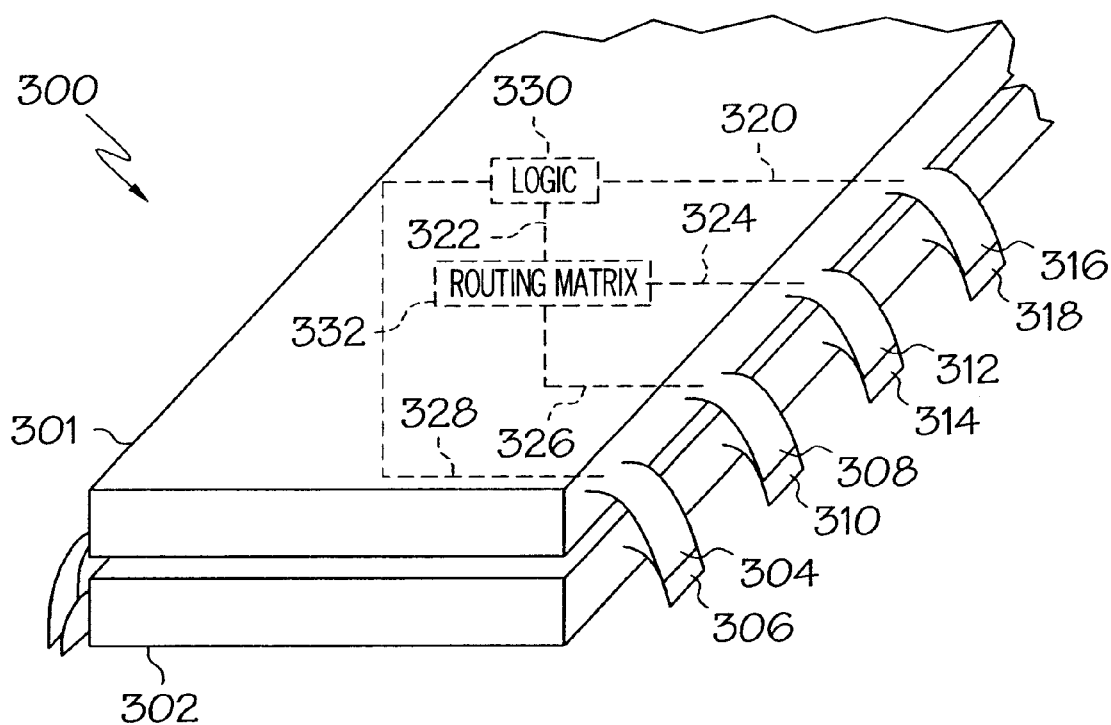
FIG. 5 is an illustration of a stacked semiconductor chip where one of the chips has had a logic line reroutable to a different pin location on the semiconductor package; and, FIG. 6 is a block diagram illustrating one embodiment of the present invention, wherein a logic circuit defines a memory device.

Referring to FIG. 5, a chip stack 300 is illustrated. The chip stack 300 includes a first chip 301, having a plurality of contact pins 304, 308, 312, 316. A second chip 302 includes contact pins 306, 310, 314, 318. The chips 301, 302 are stacked piggyback style such that select contact pins from the first chip 301 align with corresponding contact pins of the second chip 302 to form substantially vertical, conductively coupled columns. At least one of the chips 301 further includes a routing matrix 332 to internally reprogram at least one signal path 322 from the logic circuit 330 to select between pins 308 and 312 as shown, however it will be appreciated that any number of routing schemes are possible as more fully explained herein. The routing matrix 332 avoids the necessity of external frames and external rerouting circuitry otherwise required for stacking chips, and further eliminates the need for two distinct chips and duplicative testing apparatus to form the stack. Two identical chips can be stacked together, or alternatively, chips with different configurations may be stacked. Further, both chips 301, 302 may include a routing matrix, 332.

Before stacking, the first chip 301 is programmed to route the signal path 322 to either pins 308 or 312. Assume for example, that the signal path 322 is routed to pin 308. The unprogrammed pin, 312 becomes isolated from the logic circuit 330. The contact pin 310 of the second chip 302 may be an unused contact pin, or support for example, a similar function as that provided by the signal path 322 of the first chip 301. The chips 301, 302 are stacked piggyback such that the programmed pin 308 of the first chip 301 aligns vertically with the contact pin 310 on the second chip 302. The unprogrammed contact pin 312 on the first chip 301 aligns vertically with a contact pin 314 assigned to the logic in the second chip 302.

The rerouted signal can be any other external signal to be applied to the chip stack 300. Further, multiple lines can be rerouted. For example, to several lines containing input/output on the first chip 301 can be rerouted to align with unused pins on the second chip 302. Likewise, input/output pins on the second chip 302 may be routed to align with unused pins on the first chip 301. This technique can be used for any signal to the chip stack. Further, it should be appreciated by those skilled in the art that this technique applies equally to bare semiconductor dies as it does to packaged dies. Finally, any number of chips can be stacked together, depending upon the design of the rerouting matrix 332 implemented.

Figure 6:
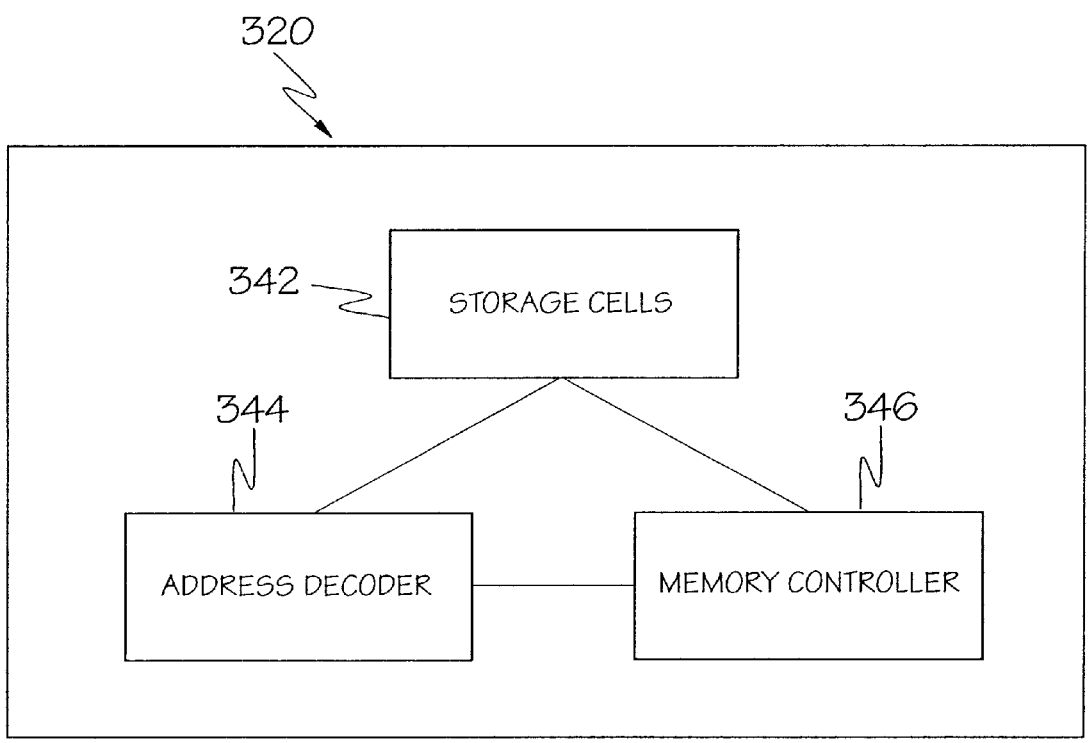

Reroutable contacts find numerous applications in the fabrication of memory devices. Referring to FIG. 6, the logic circuit 320 of a memory device typically includes an array of storage cells 342, an address decoder 344 coupled to the array of storage cells 342, and a memory controller 346 coupled to the array of storage cells 342. Referring back to FIG. 5, where the chip stack 300 comprises a stack of memory chip packages or memory chips, the plurality of conductive signal paths 320, 322, 328 coupled to the logic circuit may comprise for example, a plurality of input/output, address, and chip select conductive paths.

According to one embodiment of the present invention, the routing matrix 332 is programmable to route and insulate a chip select conductive path between at least two contacts. The non-selected contact is accordingly isolated from a memory logic circuit. Under this arrangement, the signal path 322 comprises a chip select signal routed to the logic circuit 330. The routing matrix 332 is programmable to route the chip select signal carried by the signal path 322 to either contact pin 308 via signal path 326, or to contact pin 312 via signal path 324. Assume that the second chip 302 comprises a chip select signal coupled to contact pin 310, and that contact pin 314 is unused. Then the routing matrix 332 on the first chip 301 is programmed such that the chip select or chip select signal path 322 is routed to contact pin 312 via signal path 324. Contact pin 308 is thus isolated from the logic circuit. Any power, input/output, address, or other signal paths are positioned to align in parallel configuration. Thus the chip stack 300 can share the same data, address, and power connections, yet both the first chip 301 and the second chip 302 are individually selectable because the chip select for each memory device includes a discrete connection.

Alternatively, where the first chip 301 includes multiple input/output signal paths, and a like number of unused contacts, and the second chip 302 includes the same number of unused contacts, the first chip 301 can be programmed and stacked piggyback on the second chip 302 such that the input/output signal paths of the first memory device align with unused contacts of the second memory device, and the input/output signal paths of the second memory device align with the unused contacts of the first memory device. All other contacts are positioned to align in parallel with like connections. Accordingly the power, chip select, and other reference contacts align. Under this arrangement, an enable signal enables both the first and second chips 301, 302 simultaneously, and each memory device input/output contacts are discretely routed. Thus a single address can now provide an increased word length on the total input/output signal paths available, over each memory device individually.

In addition to utility in rerouting pin assignments for stacking chips without the need for external rerouting, the present invention finds utility in providing programmable single chip solutions capable of being adapted to several different pin out assignments. For example, the same microprocessor can be utilized for several different sockets by providing the pins in a default configuration for one socket, but providing a routing matrix on the chip of sufficient sophistication to redirect signal paths to different pin connections, making the chip operable in a different socket configuration.

As a third alternative, internally reroutable options are provided. For example, a single logic chip can be utilized in a number of applications where functions and features are selectively disabled or enabled. For example, one chip can be fabricated and tested and sold as two chips, where the lesser model chip disabled features and connections. Alternatively, a user may wish to render a pin unused. In this application, the pin is isolated from the logic, but an internal signal path may need redirected. For example, in a simple application, a three input NAND gate chip can be internally converted to a two input NAND gate by disabling one of the external pin connectors leading to one of the NAND gate inputs, and internally tying the signal path that once led to the now disabled connection to the gate ON position. This allows the exact same chip die to serve multiple purposes.

It should be appreciated by those skilled in the art that programming the present invention can be practiced either before or after final assembly. The antifuse arrangement as described herein can be programmed while the semiconductor is in the form of a bare die, and then packaged in its final form, or alternatively, the bare die can be packaged, then programmed.

Having described the invention in detail and by reference to preferred embodiments thereof, it will be apparent that modifications and variations are possible without departing from the scope of the invention defined in the appended claims.

What is claimed is:

1. A memory circuit comprising:
   a logic circuit including an array of storage cells, an address decoder coupled to said array of storage cells, and a memory controller coupled to said array of storage cells;
   a first signal path having a first segment coupled to said logic circuit and a plurality of second segments, each of said plurality of second segments independent from one another;
   a routing matrix circuit in-line with said first signal path disposed between said first segment and said plurality of second segments, said routing matrix circuit programmable for each of said plurality of second segments between a first state wherein said first segment is coupled to a select one of said plurality of second segments, and a second state wherein said first segment is decoupled from said select one of said plurality of second segments; and,
   a programming circuit coupled to said routing matrix circuit, said programming circuit arranged to selectively program said routing matrix circuit between said first and second states for each of said plurality of second segments.

2. The memory circuit according to claim 1, wherein said first signal path comprises a chip select signal path.

3. The memory circuit according to claim 1, wherein said routing matrix comprises at least one antifuse positioned between said first segment and at least one of said plurality second segments.

4. The memory circuit according to claim 3, wherein said at least one antifuse is electrically isolated from said first logic circuit during programming.

5. The memory circuit according to claim 1, wherein said first signal path further comprises a plurality of first segments coupled between said logic circuit and said routing matrix circuit, and said routing matrix circuit is programmable to selectively couple and decouple any of said plurality of first segments to any of said plurality of second segments.

6. The memory circuit according to claim 5, wherein said plurality of first segments each comprise an input/output signal path.

7. The memory circuit according to claim 1, wherein said routing matrix further comprises:
   at least one antifuse;
   a programming circuit coupled to said antifuse;
   a sensing circuit coupled to said at least one antifuse; and,
   at least one switch coupled between said plurality of first segments and said plurality of second segments, and operatively coupled to said sensing circuit.

8. The memory circuit according to claim 7, wherein said sensing circuit outputs at least one switch control signal coding the programmed state of said at least one antifuse, and said at least one switch is operatively controlled by said at least one control signal.

9. The memory circuit according to claim 8, wherein said switching matrix further comprises decoding logic to control said at least one switch using said at least one control signal.

10. A memory device comprising:
    a memory chip package;
    a logic circuit contained within said memory chip package including an array of storage cells, an address decoder coupled to said array of storage cells, and a memory controller coupled to said array of storage cells;
    a plurality of contact pins coupled to said memory chip package;
    a first signal path having a first segment coupled to said logic circuit and a plurality of second segments coupled to a select one of said plurality of contact pins, each of said plurality of second segments independent from one another;
    a routing matrix circuit in-line with said first signal path disposed between said first segment and said plurality of second segments, said routing matrix circuit programmable for each of said plurality of second segments between a first state wherein said first segment is coupled to a select one of said plurality of second segments, and a second state wherein said first segment is decoupled from said select one of said plurality of second segments; and, a programming circuit coupled to said routing matrix circuit, said programming circuit arranged to selectively program said routing matrix circuit between said first and second states for each of said plurality of second segments.

11. The memory device according to claim 10, wherein said first signal path comprises a chip select signal path.

12. The memory device according to claim 10, wherein said routing matrix comprises at least one antifuse positioned between said first segment and said plurality of second segments.

13. The memory device according to claim 12, wherein said at least one antifuse is electrically isolated from said first logic circuit during programming.

14. The memory device according to claim 10, wherein said first signal path further comprises a plurality of first segments coupled between said logic circuit and said routing matrix circuit, and said routing matrix circuit is programmable to selectively couple and decouple any of said plurality of first segments to any of said plurality of second segments.

15. The memory device according to claim 14, wherein said plurality of first segments each comprise an input/output signal path.

16. The memory device according to claim 10, wherein said routing matrix further comprises:
   at least one antifuse;
   a programming circuit coupled to said antifuse;
   a sensing circuit coupled to said at least one antifuse; and,
   at least one switch coupled between said plurality of first segments and said plurality of second segments, and operatively coupled to said sensing circuit.

17. The memory device according to claim 16, wherein said sensing circuit outputs at least one switch control signal coding the programmed state of said at least one antifuse, and said at least one switch is operatively controlled by said at least one control signal.

18. The memory device according to claim 17, wherein said switching matrix further comprises decoding logic to control said at least one switch using said at least one control signal.

19. A memory device die stack comprising:
   a first semiconductor die having:
      a first logic circuit including a first array of storage cells, a first address decoder coupled to said first array of storage cells, and a first memory controller coupled to said first array of storage cells;
      a plurality of first die contact pads;
      a plurality of first die signal paths coupling said first logic circuit to said plurality of first die contact pads; and,
      a first routing matrix circuit coupled between at least one of said plurality of first die signal paths and at least one of said plurality of first die contact pads, said first routing matrix circuit programmable to selectively route any of said plurality of first die signal paths coupled to said routing matrix to any of said plurality of first die contact pads coupled to said first routing matrix circuit; and,
   a second semiconductor die having:
      a second logic circuit including a second array of storage cells, a second address decoder coupled to said second array of storage cells, and a second memory controller coupled to said second array of storage cells;
      a plurality of second die contact pads; and,
      a plurality of second die signal paths, each of said plurality of second die signal paths coupling a select one of said plurality of second die contact pads to said second die logic circuit, wherein said first and second semiconductor dies are piggybacked on each other and each of said plurality of first die contact pads is coupled to an associated one of said plurality of second die contact pads.

20. A memory device chip stack comprising:
   a first semiconductor chip having:
      a first logic circuit including a first array of storage cells, a first address decoder coupled to said first array of storage cells, and a first memory controller coupled to said first array of storage cells;
      a plurality of first chip contact pins;
      a plurality of first chip signal paths coupling said first logic circuit to said plurality of first chip contact pins; and,
      a first routing matrix circuit coupled between at least one of said plurality of first chip signal paths and at least one of said plurality of first chip contact pins, said first routing matrix circuit programmable to selectively route any of said plurality of first chip signal paths coupled to said routing matrix to any of said plurality of first chip contact pins coupled to said first routing matrix circuit; and,
   a second semiconductor chip having:
      a second logic circuit including a second array of storage cells, a second address decoder coupled to said second array of storage cells, and a second memory controller coupled to said second array of storage cells;
      a plurality of second chip contact pins; and,
      a plurality of second chip signal paths, each of said plurality of second chip signal paths coupling a select one of said plurality of second chip contact pins to said second chip logic circuit, wherein said first and second semiconductor chips are piggybacked on each other and each of said plurality of first chip contact pins is coupled to an associated one of said plurality of second chip contact pins.

21. A memory chip stack comprising:
   a first memory chip package having:
      a first logic circuit including a first array of storage cells, a first address decoder coupled to said first array of storage cells, and a first memory controller coupled to said first array of storage cells;
      a plurality of first chip contact pins coupled to said first memory chip package;
      a plurality of first chip signal paths each coupled between said first logic circuit and a select one of said plurality of first chip contact pins;
      a first chip select signal path coupled to said first logic circuit;
      a programmable routing matrix circuit coupled between said first chip select signal path and at least two of said plurality of contact pins programmed to route said first chip select signal path to a select one of said at least two of said plurality of contact pins defining a first chip unused contact pin; and,
   a second memory chip package having:
      a second logic circuit including a second array of storage cells, a second address decoder coupled to said second array of storage cells, and a second memory controller coupled to said second array of storage cells;

a plurality of second chip contact pins coupled to said second memory chip package including a second chip unused contact pin;

a plurality of second chip signal paths including a second chip select signal path each coupled between said second logic circuit and a select one of said plurality of second chip contact pins, wherein said first and second memory chip packages are stacked piggyback and each of said plurality of first chip contact pins are coupled to an associated one of said plurality of second chip contact pins such that said first chip select signal path is isolated from said second logic circuit and said second chip select signal path is isolated from said first logic circuit.

22. The memory chip stack according to claim 21, wherein said first chip select signal path is coupled to said second chip unused contact pin, and said second chip select signal path is coupled to said first chip unused contact pin.

23. The memory chip stack according to claim 21, wherein said routing matrix comprises at least one antifuse positioned between said first chip select signal path and at least one of said plurality of first chip contact pins.

24. The memory chip stack according to claim 21, wherein said routing matrix further comprises:

at least one antifuse;

a programming circuit coupled to said antifuse;

a sensing circuit coupled to said at least one antifuse; and, at least one switch coupled between said first chip select signal path and said at least two of said plurality of first chip contact pins, and operatively coupled to said sensing circuit.

25. A memory chip stack comprising:

a first memory chip package having:
   a first logic circuit including a first array of storage cells, a first address decoder coupled to said first array of storage cells, and a first memory controller coupled to said first array of storage cells;
   a plurality of first chip contact pins coupled to said first memory chip package;
   a plurality of first chip input/output signal paths coupled to said first logic circuit;
   a programmable routing matrix circuit coupled between said plurality of first chip input/output paths and said plurality of contact pins programmed to route each of said plurality of first chip input/output signal paths to a select one of said plurality of contact pins defining first chip unused contact pins; and, a second memory chip package having:
   a second logic circuit including a second array of storage cells, a second address decoder coupled to said second array of storage cells, and a second memory controller coupled to said second array of storage cells;
   a plurality of second chip contact pins coupled to said second memory chip package including a plurality of second chip unused contact pins;
   a plurality of second chip input/output signal paths each coupled between said second logic circuit and a select one of said plurality of second chip contact pins, wherein said first and second memory chip packages are stacked piggyback and each of said plurality of first chip contact pins are coupled to an associated one of said plurality of second chip contact pins such that said first chip input/output signal paths are isolated from said second logic circuit and said second chip input/output signal paths are isolated from said first logic circuit.

26. The memory chip stack according to claim 25, wherein said first chip input/output signal paths are coupled to select ones of said second chip unused contact pins, and said second chip input/output signal paths are coupled to select ones of said first chip unused contact pins.

27. The memory chip stack according to claim 25, wherein said routing matrix comprises at least one antifuse positioned between at least one of said first chip input/output signal paths and at least one of said plurality of first chip contact pins.

28. The memory chip stack according to claim 25, wherein said routing matrix further comprises:

at least one antifuse;

a programming circuit coupled to said antifuse;

a sensing circuit coupled to said at least one antifuse; and, at least one switch coupled between said first chip input/output signal paths and said plurality of first chip contact pins, and operatively coupled to said sensing circuit.

* * * * *